United States Patent
Wang

(10) Patent No.: US 11,605,684 B2
(45) Date of Patent: Mar. 14, 2023

(54) ARRAY SUBSTRATE, CONTROL METHOD THEREOF, MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Li Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/905,851

(22) Filed: Jun. 18, 2020

(65) Prior Publication Data
US 2020/0321420 A1    Oct. 8, 2020

Related U.S. Application Data

(63) Continuation-in-part of application No. PCT/CN2019/126336, filed on Dec. 18, 2019.

(30) Foreign Application Priority Data

Jan. 28, 2019 (CN) .......................... 201910080652.3

(51) Int. Cl.
*H01L 27/32* (2006.01)
*H01L 51/52* (2006.01)

(52) U.S. Cl.
CPC ...... *H01L 27/3262* (2013.01); *H01L 51/5284* (2013.01)

(58) Field of Classification Search
CPC combination set(s) only.
See application file for complete search history.

(56) References Cited

U.S. PATENT DOCUMENTS 8,144,102 B2   3/2012   Takatoku
8,395,157 B2   3/2013   Park et al.
(Continued)

FOREIGN PATENT DOCUMENTS

CN   101414436 A   4/2009
CN   102315278 A   1/2012
(Continued)

OTHER PUBLICATIONS

Office Action issued in corresponding Chinese Patent Application No. 201910080652.3, dated Jun. 1, 2020.
(Continued)

*Primary Examiner* — Moin M Rahman
*Assistant Examiner* — Mohammad A Rahman
(74) *Attorney, Agent, or Firm* — McDermott Will & Emery LLP

(57) ABSTRACT

An array substrate, including: a base substrate including a display area and a non-display area; a first transistor in the display area; a second transistor in the non-display area; and a substrate electrode, the substrate electrode including: a first substrate electrode between the first transistor and the base substrate; and a second substrate electrode between the second transistor and the base substrate, wherein the first substrate electrode and the second substrate electrode are configured to adjust threshold voltages of the first transistor and the second transistor, respectively, there is an open circuit between the first substrate electrode and the second substrate electrode, the first substrate electrode is supplied
(Continued)

with a first adjustment voltage, the second substrate electrode is supplied with a second adjustment voltage, and an absolute value of the first adjustment voltage is different from an absolute value of the second adjustment voltage.

15 Claims, 9 Drawing Sheets

(56) References Cited

U.S. PATENT DOCUMENTS

| | | | |
|---|---|---|---|
| 8,853,016 B2 | 10/2014 | Park et al. | |
| 9,659,968 B2 | 5/2017 | Koezuka et al. | |
| 10,326,420 B1* | 6/2019 | Bellaouar | H04B 1/16 |
| 10,446,589 B2 | 10/2019 | Lou et al. | |
| 2003/0020065 A1 | 1/2003 | Honda | |
| 2005/0092991 A1 | 5/2005 | Ahn et al. | |
| 2009/0283763 A1* | 11/2009 | Park | H01L 27/1225 |
| | | | 257/E29.296 |
| 2015/0162251 A1* | 6/2015 | Jeong | H01L 27/124 |
| | | | 438/158 |
| 2018/0061859 A1 | 3/2018 | Wen | |
| 2018/0348923 A1* | 12/2018 | Liu | G02F 1/136286 |
| 2020/0043955 A1* | 2/2020 | Suzuki | H01L 27/1251 |
| 2020/0321420 A1 | 10/2020 | Wang | |
| 2020/0341329 A1 | 10/2020 | Zhao | |

FOREIGN PATENT DOCUMENTS

| | | |
|---|---|---|
| CN | 104103668 A | 10/2014 |
| CN | 104425545 A | 3/2015 |
| CN | 105785635 A | 7/2016 |
| CN | 106024811 A | 10/2016 |
| CN | 106847834 A | 6/2017 |
| CN | 106920804 A | 7/2017 |
| CN | 107092117 A | 8/2017 |
| CN | 107978610 A | 5/2018 |
| CN | 109390410 A | 2/2019 |
| CN | 109768053 A | 5/2019 |
| JP | 2003-280034 A | 10/2003 |

OTHER PUBLICATIONS

Office Action issued in corresponding Chinese Patent Application No. 201910080652.3, dated May 8, 2021.

* cited by examiner

```
┌─────────────────────────────────────────────────────────┐
│  determining the threshold voltages of both the first   │──  41
│  transistor and the second transistor                    │
└─────────────────────────────────────────────────────────┘
                            │
                            ▼
┌─────────────────────────────────────────────────────────┐
│ supplying a driving voltage to the first transistor and the second │
│ transistor, in a case where the substrate electrode is provided on │── 42
│   a side of one of the first transistor and the second transistor  │
│     away from the light exiting direction, setting the driving     │
│   voltage to be equal to the threshold voltage of the other one of │
│   the first transistor and the second transistor, below which the  │
│         substrate electrode is not provided, and supplying an       │
│   adjustment voltage to the substrate electrode so that the one of │
│    the first transistor and the second transistor, below which the │
│  substrate electrode is provided, operates at its threshold voltage;│
│   in a case where the substrate electrode is provided on sides of  │
│   both the first transistor and the second transistor away from the│
│         light exiting direction, according to the driving voltage, │
│    supplying a first adjustment voltage to the substrate electrode │
│      on the side of the first transistor away from the light exiting│
│        direction so that the first transistor operates at its threshold│
│        voltage, and supplying a second adjustment voltage to the   │
│      substrate electrode on the side of the second transistor away │
│         from the light exiting direction so that the second transistor│
│                   operates at its threshold voltage                 │
└─────────────────────────────────────────────────────────┘
```

FIG. 11

ARRAY SUBSTRATE, CONTROL METHOD THEREOF, MANUFACTURING METHOD THEREOF, DISPLAY PANEL AND DISPLAY DEVICE

CROSS-REFERENCE TO RELATED APPLICATION

This application is a continuation-in-part of International Application No. PCT/CN2019/126336, filed on Dec. 18, 2019, entitled "array substrate, control method thereof, manufacturing method thereof, display panel and display device", which in turn claims the benefit of Chinese Patent Application No. 201910080652.3 filed on Jan. 28, 2019 in the National Intellectual Property Administration of China, the whole disclosures of which are incorporated herein by reference.

TECHNICAL FIELD

The present disclosure relates to the field of display technology, in particular to an array substrate, a control method thereof, a manufacturing method thereof, a display panel, and a display device.

BACKGROUND

In an active matrix display panel, an array of thin film transistor (abbreviated as TFT) is usually provided on an array substrate. It is very important for a display effect whether the TFT is in a normal working state. A threshold voltage of the TFT is an important factor that affects the working state of the TFT. However, in the related art, the threshold voltage of the TFT is basically fixed once the TFT has been fabricated, so that it is difficult to adjust the threshold voltage after the TFT has been fabricated.

SUMMARY

In one aspect, an array substrate is provided, comprising: a base substrate comprising a display area and a non-display area; a first transistor in the display area; a second transistor in the non-display area; and a substrate electrode, the substrate electrode comprising: a first substrate electrode between the first transistor and the base substrate; and a second substrate electrode between the second transistor and the base substrate, wherein the first substrate electrode and the second substrate electrode are configured to adjust threshold voltages of the first transistor and the second transistor, respectively, there is an open circuit between the first substrate electrode and the second substrate electrode, the first substrate electrode is supplied with a first adjustment voltage, the second substrate electrode is supplied with a second adjustment voltage, and an absolute value of the first adjustment voltage is different from an absolute value of the second adjustment voltage.

According to some exemplary embodiments, an absolute value of the threshold voltage of the first transistor is different from an absolute value of the threshold voltage of the second transistor.

According to some exemplary embodiments, the absolute value of the threshold voltage of the first transistor is smaller than the absolute value of the threshold voltage of the second transistor.

According to some exemplary embodiments, the absolute value of the first adjustment voltage is smaller than the absolute value of the second adjustment voltage.

According to some exemplary embodiments, the first adjustment voltage is equal to 0 volt.

According to some exemplary embodiments, the first substrate electrode is a planar electrode, a plurality of first transistors are provided, and projections of the plurality of first transistors on a plane, where the first substrate electrode is located, are all located in the first substrate electrode; and/or, the second substrate electrode is a planar electrode, a plurality of second transistors are provided, and projections of the plurality of second transistors on a plane, where the second substrate electrode is located, are all located in the second substrate electrode.

According to some exemplary embodiments, a plurality of first substrate electrodes are provided, the plurality of first substrate electrodes are arranged in an array, a plurality of first transistors are provided, the plurality of first transistors are arranged in an array, and projections of the plurality of first transistors on a plane, where the first substrate electrodes are located, are located in the plurality of first substrate electrodes in one-to-one correspondence; and/or, a plurality of second substrate electrodes are provided, the plurality of second substrate electrodes are arranged in an array, a plurality of second transistors are provided, the plurality of second transistors are arranged in an array, and projections of the plurality of second transistors on a plane, where the second substrate electrodes are located, are located in the plurality of second substrate electrodes in one-to-one correspondence.

According to some exemplary embodiments, the first transistor comprises a gate electrode, and a projection of the gate electrode of the first transistor on a plane, where the first substrate electrode is located, is located in the first substrate electrode. Alternatively or additionally, the second transistor comprises a gate electrode, and a projection of the gate electrode of the second transistor on a plane, where the second substrate electrode is located, is located in the second substrate electrode.

According to some exemplary embodiments, the array substrate further comprises a buffer layer on the base substrate, and each of the first transistor and the second transistor comprises an active layer, and the active layer is located on a side of the buffer layer away from the base substrate, and the first substrate electrode and the second substrate electrode are both located on a side of the buffer layer close to the base substrate.

According to some exemplary embodiments, a part of the buffer layer is located between the first substrate electrode and the second substrate electrode, so that there is the open circuit between the first substrate electrode and the second substrate electrode.

According to some exemplary embodiments, the first substrate electrode and the second substrate electrode are located in the same layer.

According to some exemplary embodiments, each of the first transistor and the second transistor comprises an active layer, and a projection of the active layer of the first transistor on a plane, where the first substrate electrode is located, is located in the first substrate electrode, and a projection of the active layer of the second transistor on a plane, where the second substrate electrode is located, is located in the second substrate electrode.

According to some exemplary embodiments, the array substrate further comprises a light shielding layer, wherein the light shielding layer is configured to prevent light from a back side of the array substrate from illuminating an active layer of each of the first transistor and the second transistor, and the substrate electrode and the light shielding layer are located in the same layer.

According to some exemplary embodiments, the first transistor is a driving transistor of a pixel driving circuit, and the second transistor is a driving transistor of a GOA driving circuit.

In another aspect, an array substrate is provided, comprising: a base substrate comprising a display area and a non-display area; a first transistor in the display area; a second transistor in the non-display area; and a substrate electrode between the base substrate and one of the first transistor and the second transistor, wherein a projection of the one of the first transistor and the second transistor on a plane, where the substrate electrode is located, is located in the substrate electrode, and a projection of the other one of the first transistor and the second transistor on the plane, where the substrate electrode is located, is spaced from the substrate electrode, and the substrate electrode is supplied with an adjustment voltage having an absolute value greater than 0, so as to adjust a threshold voltage of the one of the first transistor and the second transistor.

In a further aspect, a display panel comprising the array substrate as described above is provided.

In another further aspect, a display device comprising the array substrate as described above is provided.

In another further aspect, a control method of an array substrate as described above is provided, wherein the control method comprises:

determining threshold voltages of both the first transistor and the second transistor;

supplying a driving voltage to the first transistor, and supplying a first adjustment voltage to the first substrate electrode according to the driving voltage supplied to the first transistor, so that the first transistor operates at its threshold voltage; and supplying a driving voltage to the second transistor, and supplying a second adjustment voltage to the second substrate electrode according to the driving voltage supplied to the second transistor, so that the second transistor operates at its threshold voltage.

In another further aspect, a control method of an array substrate as described above is provided, wherein the control method comprises:

determine threshold voltages of both the first transistor and the second transistor;

supplying a driving voltage, which is set to be equal to the threshold voltage of one of the first transistor and the second transistor which is not provided with the substrate electrode, to both the first transistor and the second transistor; and supplying an adjustment voltage to the substrate electrode, so that the other one of the first transistor and the second transistor which is provided with the substrate electrode operates at its threshold voltage.

In another further aspect, a method of manufacturing an array substrate is provided, comprising:

forming a first substrate electrode and a second substrate electrode on a base substrate; and forming a first transistor in a display area and on a side of the first substrate electrode away from the base substrate, and forming a second transistor in a non-display area and on a side of the second substrate electrode away from the base substrate, wherein the first substrate electrode and the second substrate electrode are configured to adjust threshold voltages of the first transistor and the second transistor, respectively, there is an open circuit between the first substrate electrode and the second substrate electrode, the first substrate electrode is supplied with a first adjustment voltage, the second substrate electrode is supplied with a second adjustment voltage, and an absolute value of the first adjustment voltage is different from an absolute value of the second adjustment voltage.

BRIEF DESCRIPTION OF THE DRAWINGS

In order to describe technical solutions of embodiments of the present disclosure more clearly, accompanying drawings of the embodiments will be briefly described below. Obviously, the drawings in the following description only relate to some embodiments of the present disclosure, rather than limiting the present disclosure.

FIG. 11 is a schematic flowchart of a method of controlling an array substrate according to some embodiments of the present disclosure.

DETAILED DESCRIPTION OF EMBODIMENTS

In order to make objectives, technical solutions, and advantages of embodiments of the present disclosure more clear, the technical solutions of the embodiments of the present disclosure will be described clearly and completely in conjunction with the drawings of the embodiments of the present disclosure. Obviously, the described embodiments are a part of the embodiments of the present disclosure, but not all the embodiments. Based on the described embodiments of the present disclosure, all other embodiments obtained by those skilled in the art without creative efforts shall fall within the protection scope of the present disclosure.

Unless otherwise defined, technical or scientific terms used in the present disclosure shall have the usual meanings understood by persons of ordinary skill in the field to which this disclosure belongs. Terms "first", "second" and similar words used in the present disclosure do not indicate any order, quantity or importance, but are only used to distinguish different components. Similarly, words like "a", "one" or "the" do not mean quantity limitation, but mean that there is at least one. Words such as "include", "including", "comprise", "comprising" or the like mean that elements or objects preceding these words contain elements or objects following these words and their equivalents, without excluding other elements or objects. Words such as "connecting", "connected" or the like are not limited to physical or mechanical connections, but may also include electrical connections, regardless of these connections are direct or indirect. Words such as "up", "down", "left", "right", or the like are only used to indicate relative positional relationships, and the relative positional relationships may change accordingly when absolute positions of described object change.

In a first aspect of the embodiments of the present disclosure, an array substrate is provided, which may solve a problem, which is caused by a difference in threshold voltage, to a certain extent.

Figure 1:
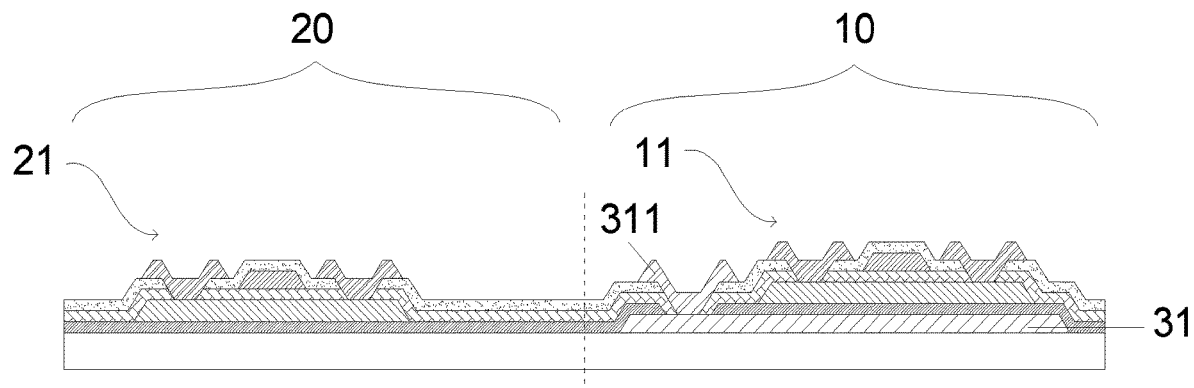
FIG. 1 is a schematic structural view of an array substrate according to some embodiments of the present disclosure.
Figure 2:
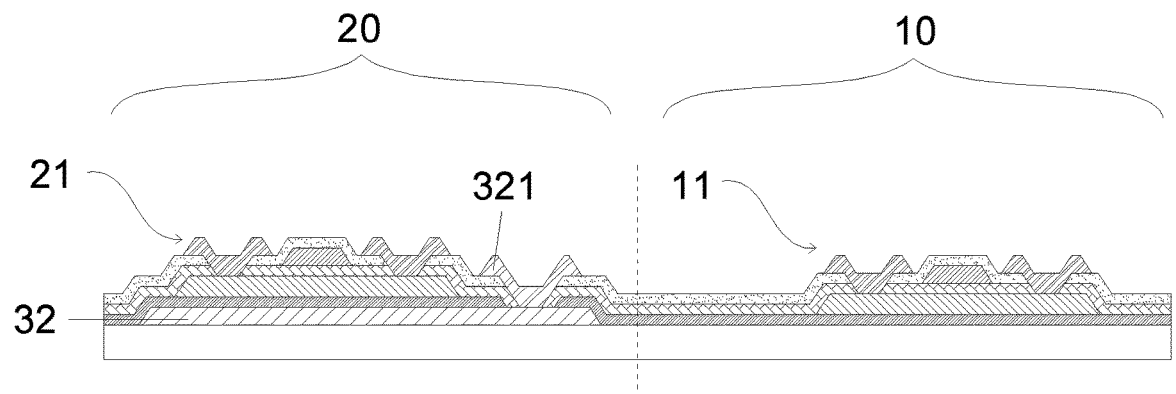
FIG. 2 is a schematic structural view of an array substrate according to some embodiments of the present disclosure.

Referring to FIG. 1 and FIG. 2, the array substrate may include a first transistor 11 in a display area 10 of the array substrate and a second transistor 21 in a non-display area 20 of the array substrate. The array substrate may further include substrate electrodes 31/32. As shown in FIG. 1, the substrate electrode 31 is disposed on a side of the first transistor 11 away from a light exiting direction, that is, disposed between the first transistor 11 and a base substrate, for adjusting a threshold voltage of the first transistor 11. As shown in FIG. 2, the substrate electrode 32 is disposed on a side of the second transistor 21 away from the light exiting direction, that is, disposed between the second transistor 21 and the base substrate, for adjusting a threshold voltage of the second transistor 21. Optionally, the display area 10 may refer to a pixel area of the array substrate, and the non-display area 20 may refer to a GOA (gate driver on array substrate) area of the array substrate.

When the transistors on the array substrate are in operation, threshold voltages of the transistors at corresponding positions of the substrate electrodes 31/32 may be adjusted based on the principle of substrate bias effect, by supplying certain adjustment voltages to the substrate electrodes 31/32, so that the transistors operate at an ideal state.

The so-called substrate bias effect may be understood as follows. During the transistor is operating, after a channel (inversion layer) is produced in an active layer, a thickness of a depletion layer below the channel reaches the maximum (at this time, the thickness of the depletion layer will not increase anymore even if a voltage of a gate electrode increases), however, a substrate bias voltage (that is, the adjustment voltage applied to the substrate electrode 31/32) is a reverse voltage directly applied between a source electrode and a base substrate, so that it may further widen the thickness of the depletion layer of a field-inducing junction and increase an area density of spatial charges in the depletion layer, thereby increasing the threshold voltage of the transistor.

In the array substrate according to the embodiments of the present disclosure, a projection of one of the first transistor 11 and the second transistor 21 on a plane, where the substrate electrode 31/32 is located, is located in the substrate electrode 31/32. And a projection of the other one of the first transistor 11 and the second transistor 21 on the plane, where the substrate electrode 31/32 is located, does not overlap with the substrate electrode 31/32. In other words, the projection of the other one of the first transistor 11 and the second transistor 21 on the plane, where the substrate electrode 31/32 is located, is spaced apart from the substrate electrode 31/32. As shown in FIG. 1, a projection of the first transistor 11 on the plane, where the substrate electrode 31 is located, is located in the substrate electrode 31, and a projection of the second transistor 21 on the plane, where the substrate electrode 31 is located, does not overlap with (or is spaced apart from) the substrate electrode 31. As shown in FIG. 2, the projection of the second transistor 21 on the plane, where the substrate electrode 32 is located, is located in the substrate electrode 32, and the projection of the first transistor 11 on the plane, where the substrate electrode 32 is located, does not overlap with (or is spaced apart from) the substrate electrode 32. The substrate electrode is supplied with an adjustment voltage having an absolute value greater than 0, and is configured to adjust a threshold voltage of one of the first transistor and the second transistor. For example, in the embodiments shown in FIG. 1, the substrate electrode 31 is supplied with an adjustment voltage having an absolute value greater than 0, for adjusting the threshold voltage of the first transistor 11. In the embodiments shown in FIG. 2, the substrate electrode 32 is supplied with an adjustment voltage having an absolute value greater than 0, for adjusting the threshold voltage of the second transistor 21. In this way, by providing the substrate electrode on a side of the transistor away from a light exiting direction, the threshold voltage of the transistor which is located above the substrate electrode may be adjusted by using the substrate electrode based on the principle of the substrate bias effect. In this way, even if the threshold voltage of the transistor is deviated due to a manufacturing process thereof, the threshold voltage of the transistor may be adjusted by using the substrate electrode so that the transistor may operate in an ideal state.

Figure 3:
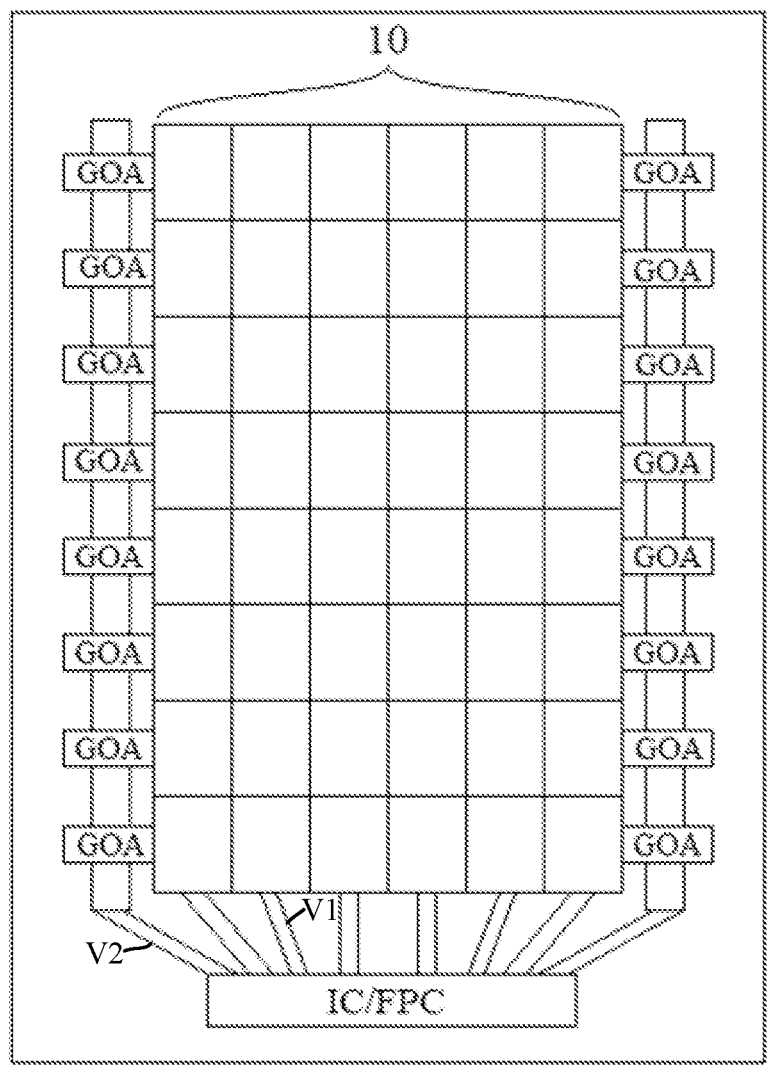
FIG. 3 is a schematic plan view of an array substrate according to some embodiments of the present disclosure.

FIG. 3 is a schematic plan view of an array substrate according to some embodiments of the present disclosure. Referring to FIG. 3, the display area 10 of the array substrate may be a pixel area, and the non-display area 20 of the array substrate may be a GOA area. Specifically, a plurality of pixel driving circuits may be provided in the pixel area, and a plurality of GOA driving circuits may be provided in the GOA area.

Figure 4:
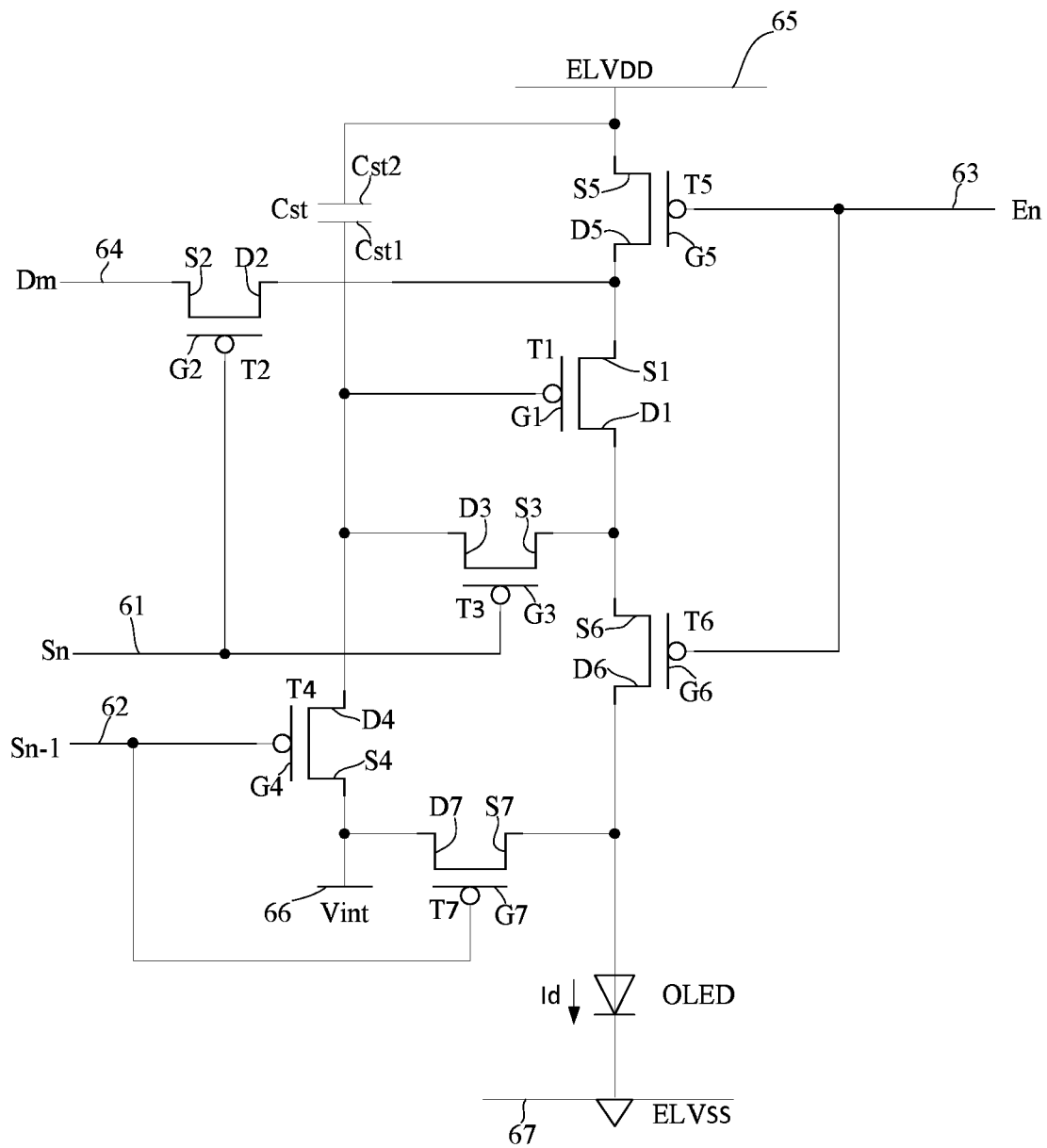
FIG. 4 is a schematic view of a pixel driving circuit on an array substrate according to some embodiments of the present disclosure.
Figure 5:
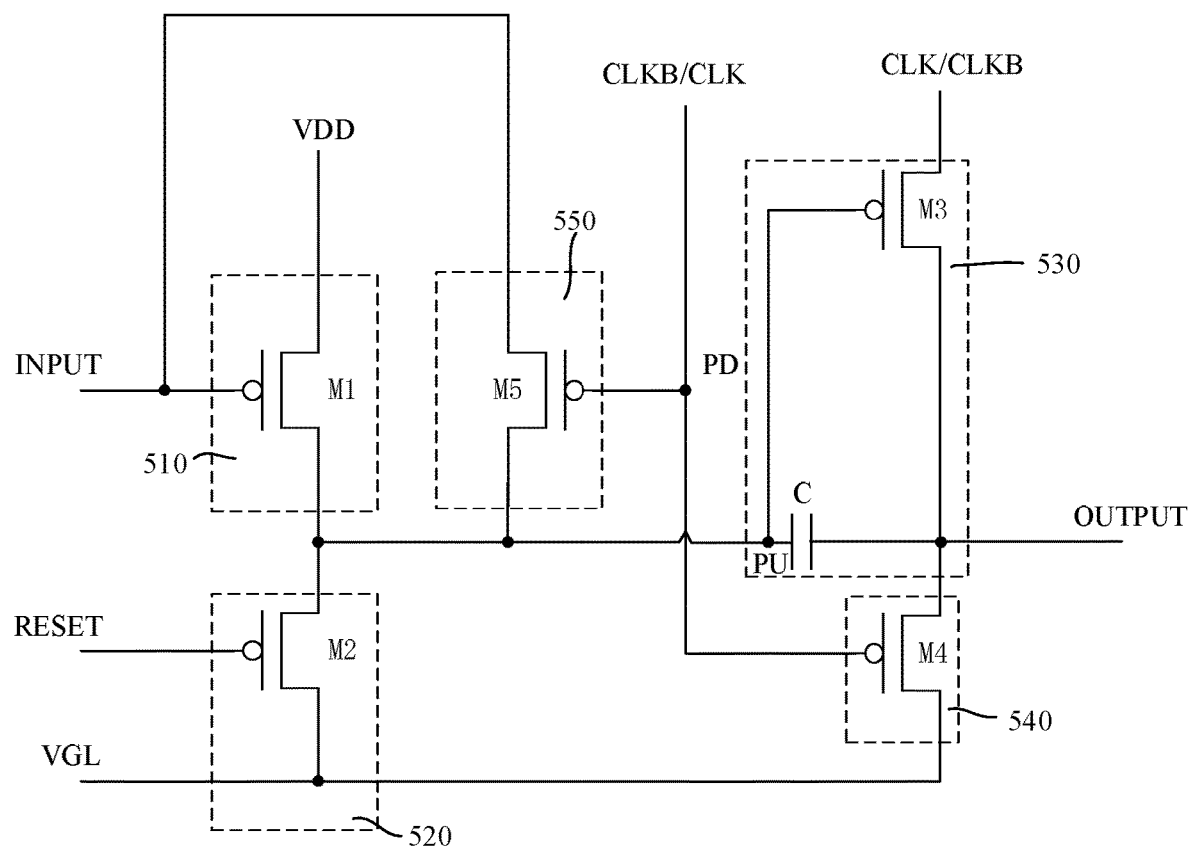
FIG. 5 is a schematic view of a GOA driving circuit on an array substrate according to some embodiments of the present disclosure.

FIG. 4 is a schematic view of a pixel driving circuit according to some exemplary embodiments of the present disclosure, and FIG. 5 is a schematic view of a GOA driving circuit according to some exemplary embodiments of the present disclosure.

As shown in FIG. 4, the pixel driving circuit may include a plurality of signal lines 61, 62, 63, 64, 65, 66 and 67, a plurality of thin film transistors T1, T2, T3, T4, T5, T6 and T7, and a storage capacitor Cst. For example, the pixel driving circuit is configured to drive an organic light emitting diode (i.e., OLED).

The plurality of thin film transistors include a driving thin film transistor T1, a switching thin film transistor T2, a compensation thin film transistor T3, an initialization thin film transistor T4, an operation control thin film transistor T5, an emission control thin film transistor T6, and a bypass thin film transistor T7.

The plurality of signal lines include a scan signal line 61 for transmitting a scan signal Sn, a previous scan signal line 62 for transmitting a previous scan signal Sn−1 to the initialization thin film transistor T4, an emission control line 63 for transmitting an emission control signal En to the operation control thin film transistor T5 and the emission control thin film transistor T6, a data line 64 for transmitting a data signal Dm, a driving voltage line 65 for transmitting a driving voltage ELVDD, an initialization voltage line 66 for transmitting an initialization voltage Vint to the driving thin film transistor T1, and a power supply line 67 for transmitting the ELVSS voltage.

A gate electrode G1 of the driving thin film transistor T1 is electrically connected to one end Cst1 (hereinafter referred to as a first capacitor electrode) of the storage capacitor Cst, a source electrode S1 of the driving thin film transistor T1 is electrically connected to the driving voltage line 65 via the operation control thin film transistor T5, and a drain electrode D1 of the thin film transistor T1 is electrically connected to an anode of the OLED via the emission control thin film transistor T6. The driving thin film transistor T1 receives the data signal Dm according to a switching operation of the switching thin film transistor T2 to supply a driving current Id to the OLED.

A gate electrode G2 of the switching thin film transistor T2 is electrically connected to the scan signal line 61, a source electrode S2 of the switching thin film transistor T2 is electrically connected to the data line 64, and a drain electrode D2 of the switching thin film transistor T2 is electrically connected to the driving voltage line 65 via the operation control thin film transistor T5, and it is also electrically connected to the source electrode S1 of the driving thin film transistor T1. The switching thin film transistor T2 is turned on according to the scan signal Sn transmitted via the scan signal line 64 to perform the switching operation, so as to transmit the data signal Dm transmitted to the data line 64 to the source electrode S1 of the driving thin film transistor T1.

A gate electrode G3 of the compensation thin film transistor T3 is electrically connected to the scan signal line 61, a source electrode S3 of the compensation thin film transistor T3 is electrically connected to the anode of the OLED via the emission control thin film transistor T6, and it is also electrically connected to the drain electrode D1 of the driving thin film transistor T1. The drain electrode D3 of the compensation thin film transistor T3 is electrically connected to one end (i.e., the first capacitor electrode) Cst1 of the storage capacitor Cst, a drain electrode D4 of the initialization thin film transistor T4, and the gate electrode G1 of the driving thin film transistor T1. The compensation thin film transistor T3 is turned on according to the scan signal Sn transmitted via the scan signal line 61 to connect the gate electrode G1 and the drain electrode D1 of the driving thin film transistor T1, thereby placing the driving thin film transistor T1 in a diode-connected state.

A gate electrode G4 of the initialization thin film transistor T4 is electrically connected to the previous scan signal line 62, and a source electrode S4 of the initialization thin film transistor T4 is electrically connected to the initialization voltage line 66. And a drain electrode D4 of the initialization thin film transistor T4 is electrically connected to the one end Cst1 of the storage capacitor Cst1, the drain electrode D3 of the compensation thin film transistor T3, and the gate electrode G1 of the driving thin film transistor T1. The initialization thin film transistor T4 is turned on according to the previous scan signal Sn−1 transmitted via the previous scan signal line 62 to transmit the initialization voltage Vint to the gate electrode G1 of the driving thin film transistor T1, thereby performing an initialization operation to initial a voltage of the gate electrode G1 of the driving thin film transistor T1.

A gate electrode G5 of the operation control thin film transistor T5 is electrically connected to the emission control line 63, and a source electrode S5 of the operation control thin film transistor T5 is electrically connected to the driving voltage line 65. And a drain electrode D5 of the operation control thin film transistor T5 is electrically connected to the source electrode S1 of the driving thin film transistor T1 and the drain electrode D2 of the switching thin film transistor T2.

A gate electrode G6 of the emission control thin film transistor T6 is electrically connected to the emission control line 63, and a source electrode S6 of the emission control thin film transistor T6 is electrically connected to the drain electrode D1 of the driving thin film transistor T1 and to the source electrode S3 of the compensation thin film transistor T3. And a drain electrode D6 of the emission control thin film transistor T6 is electrically connected to the anode of the OLED. The operation control thin film transistor T5 and the emission control thin film transistor T6 are turned on concurrently (for example, simultaneously) according to the emission control signal En transmitted via the emission control line 63 to transmit the driving voltage ELVDD to the OLED, thereby allowing the driving current Id to flow into the OLED.

The bypass thin film transistor T7 includes: a gate electrode G7 connected to the previous scan signal line 62; a source electrode S7 connected to the drain electrode D6 of the emission control thin film transistor T6 and the anode of the OLED; and a drain electrode D7 connected to the initialization voltage line 66. The bypass thin film transistor T7 transmits the previous scan signal Sn−1 from the previous scan signal line 62 to the gate electrode G7.

The other end (hereinafter referred to as a second capacitive electrode) Cst2 of the storage capacitor Cst is electrically connected to the driving voltage line 65, and a cathode of the OLED is electrically connected to the power supply line 67 to receive a common voltage ELVSS. Accordingly, the OLED receives the driving current Id from the driving thin film transistor T1 to emit light, thereby displaying an image.

As shown in FIG. 5, the GOA driving circuit may be a shift register unit, for example, it may include a pull-up control module 510, a reset module 520, an output module 530, a first control module 540, and a second control module 550.

The pull-up control module 510 may be connected to a first signal input terminal INPUT, a first voltage terminal VDD, and a pull-up control node PU, respectively, for transmitting a voltage of the first voltage terminal VDD to the pull-up control node PU under the control of an input signal of the first signal input terminal INPUT.

The reset module 520 may be connected to a second signal input terminal RESET, a second voltage terminal VGL and the pull-up control node PU, respectively, for pulling down the potential of the pull-up control node PU to a voltage of the second voltage terminal VGL under the control of an input signal of the second signal input terminal RESET, so as to reset the pull-up control node PU.

The output module 530 may be connected to a first clock signal terminal CLK/CLKB, the pull-up control node PU, and a signal output terminal OUTPUT, respectively, for transmitting an input signal of the first clock signal terminal CLK/CLKB to the signal output terminal OUTPUT under the control of the pull-up control node PU.

The first control module 540 may be connected to a second clock signal terminal CLKB/CLK through a pull-down control node PD, and also connected to the signal output terminal OUTPUT and the second voltage terminal VGL, for pulling down the signal output terminal OUTPUT to the voltage of the second voltage terminal VGL under the control of the pull-down control node PD, so as to reduce noise on the signal output terminal OUTPUT.

The second control module 550 may be connected to the second clock signal terminal CLKB/CLK through the pull-down control node PD, and also connected to the first signal input terminal INPUT and the pull-up control node PU, for controlling the potential of the pull-down control node through the second clock signal terminal CLKB/CLK, and pulling up or pulling down the potential of the pull-up control node PU to the voltage input by the first signal input terminal INPUT under the control of the pull-down control node PD.

It should be noted that the clock signal terminal for inputting the clock signal CLK or CLKB to the output module 530 is called as the first clock signal terminal, and is represented by CLK/CLKB; and the clock signal terminal for inputting the clock signal CLK or CLKB to the first control module 540 and the second control module 550 is called as the second clock signal terminal, and is represented by CLKB/CLK. The clock signal input from the first clock signal terminal CLK/CLKB and the clock signal input from the second clock signal terminal CLKB/CLK have opposite directions and the same width. That is, when the first clock signal terminal CLK/CLKB inputs the clock signal CLK, the second clock signal terminal CLKB/CLK inputs the clock signal CLKB; alternatively, when the first clock signal terminal CLK/CLKB inputs the clock signal CLKB, the second clock signal terminal CLKB/CLK inputs the clock signal CLK.

For example, the first voltage terminal VDD inputs a high level, and the second voltage terminal VGL inputs a low level.

In some exemplary embodiments, the pull-up control module 510 may include a first transistor M1. A gate electrode of the first transistor M1 is connected to the first signal input terminal INPUT, a first electrode of the first transistor M1 is connected to the first voltage terminal VDD, and the second electrode of the first transistor M1 is connected to the pull-up control node PU. Specifically, when the signal input from the first signal input terminal INPUT turns on the first transistor M1, the potential of the pull-up control node PU may be pulled up to the voltage of the first voltage terminal VDD through the first transistor M1, and the capacitor C may be charged through the pull-up control node PU so as to prepare for the shift register unit to output the scan signal.

The reset module 520 may include a second transistor M2. A gate electrode of the second transistor M2 is connected to the second signal input terminal RESET, a first electrode of the second transistor M2 is connected to the pull-up control node PU, and the second electrode of the second transistor M2 is connected to the second voltage terminal VGL. Specifically, when the signal input from the second signal input terminal RESET turns on the second transistor M2, the potential of the pull-up control node PU may be pulled down to the voltage input by the second voltage terminal VGL through the second transistor M2, so as to reduce noise on the pull-up control node PU, thereby preventing false-output at the signal output terminal OUTPUT of the shift register unit due to the rise of the potential of the pull-up control node PU, which mistakenly turns on the output module 530.

The output module 530 may include a third transistor M3 and a capacitor C. A gate electrode of the third transistor M3 is connected to the pull-up control node PU, a first electrode of the third transistor M3 is connected to the first clock signal terminal CLK/CLKB, and the second electrode of the third transistor M3 is connected to the signal output terminal OUTPUT. One end of the capacitor C is connected to the pull-up control node PU, and the other end is connected to the signal output terminal OUTPUT. Specifically, under the control of the pull-up control node PU, the third transistor M3 may be turned on to output the signal input from the first clock signal terminal CLK/CLKB to the signal output terminal OUTPUT through the third transistor M3, so that such the signal may be output as the scan signal.

The first control module 540 may include a fourth transistor M4. A gate electrode of the fourth transistor M4 is connected to the second clock signal terminal CLKB/CLK through the pull-down control node PD, a first electrode of the fourth transistor M4 is connected to the signal output terminal OUTPUT, and a second electrode of the fourth transistor M4 is connected to the second voltage terminal VGL. Specifically, under the control of the pull-down control node PD, the fourth transistor M4 may be turned on to pull down the signal output from the signal output terminal OUTPUT to the potential of the second voltage terminal VGL through the fourth transistor M4, thereby reduce the noise on the signal output terminal OUTPUT.

The second control module 550 may include a fifth transistor M5. A gate electrode of the fifth transistor M5 is connected to the second clock signal terminal CLKB/CLK through the pull-down control node PD, a first electrode of the fifth transistor M5 is connected to the first signal input terminal INPUT, and a second electrode of the fifth transistor M5 is connected to the pull-up control node PU. Specifically, under the control of the pull-down control node PD, the fifth transistor M5 may be turned on to pull up or pull down the potential of the pull-up control node PU to the signal input from the first signal input terminal INPUT through the fifth transistor M5. When the first signal input terminal INPUT inputs a high level, the capacitor C may be charged, and when the first signal input terminal INPUT inputs a low level, noise on the pull-up control node PU may be reduced.

It should be noted that the first electrode of the transistor mentioned above may be one of the source electrode and the drain electrode of the thin film transistor, and the second electrode may be the other one of the source electrode and the drain electrode of the thin film transistor.

It should also be noted that in the embodiments shown in FIGS. 4 and 5, each thin film transistor has a single-gate electrode structure, however, the embodiments of the present disclosure are not limited thereto, and at least some of the thin film transistors may have a dual-gate electrode structure. In addition, each thin film transistor is a p-channel field effect transistor, but the embodiments of the present disclosure are not limited thereto, and at least some of the thin film transistors may be n-channel field effect transistors.

It should also be noted that the structures of the pixel driving circuit and the GOA driving circuit described in the embodiments shown in FIGS. 4 and 5 are merely some exemplary implementations, and the embodiments of the present disclosure are not limited thereto. The array substrate according to the embodiments of the present disclosure may include pixel driving circuits and GOA driving circuits having other structures.

In some exemplary embodiments of the present disclosure, the first transistor 11 may include at least one selected from the transistors T1, T2, T3, T4, T5, T6, and T7 in the pixel driving circuit, and the second transistor 21 may include at least one selected from the transistors M1, M2, M3, M4, and M5 in the GOA driving circuit. For example, the first transistor 11 may be the above-mentioned driving thin film transistor T1, and the second transistor 21 may be the above-mentioned third transistor M3.

In a manufacturing process of the display panel, under the same process and process conditions, an absolute value of a threshold voltage Vth of a TFT with a larger size is significantly larger than an absolute value of a threshold voltage Vth of a TFT with a smaller size. The size of the TFT located in the display area is usually smaller than that of the TFT located in the GOA area, so that a difference between the threshold voltages of the two TFTs is relatively large. As a result, a control of the manufacturing process is too difficult to be meet requirements on threshold voltages Vth of both the pixel driving circuit and the GOA driving circuit, resulting in poor circuit function or even failure.

Figure 6:
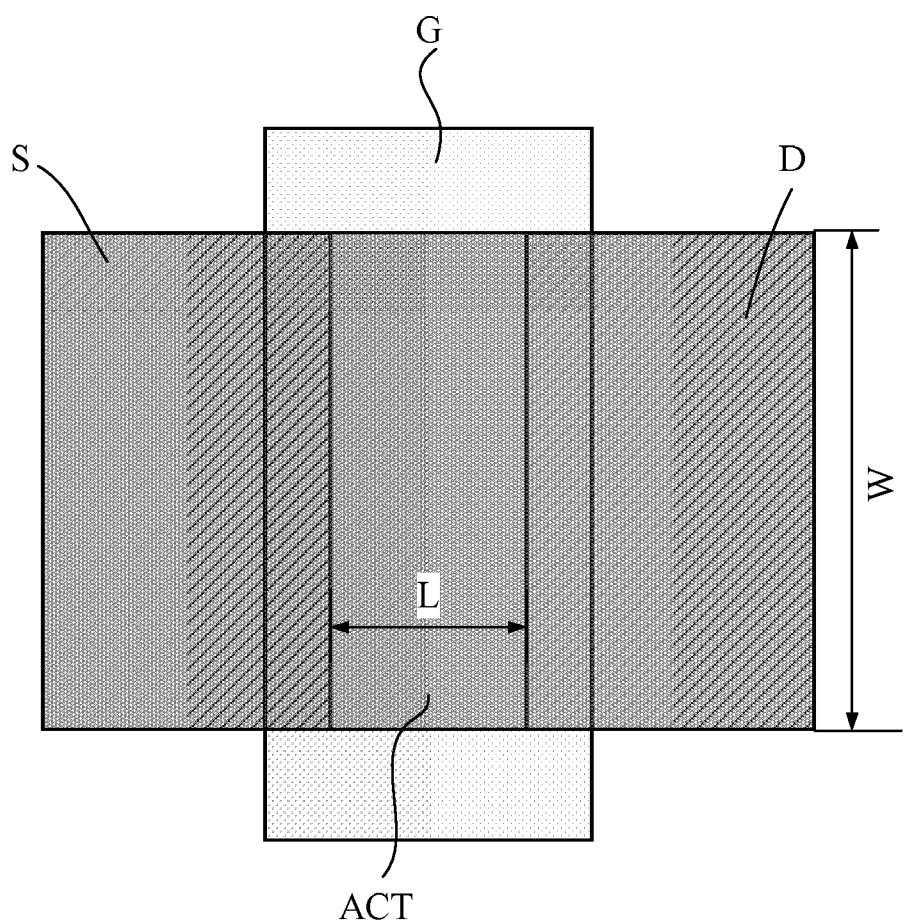
FIG. 6 is a schematic plan view of a thin film transistor.

FIG. 6 is a schematic plan view of a thin film transistor. Referring to FIG. 6, the thin film transistor may include a gate electrode G, a source electrode S, a drain electrode D, and an active layer ACT. The active layer ACT includes a channel between the source electrode S and the drain electrode D, the channel having a length L and a width W.

For example, in a low-temperature polysilicon organic light-emitting diode (LTPS OLED) display design, the pixel driving circuit employs a smaller size TFT (for example, the width-to-length ratio of the channel W/L=3 μm/3 μm), and the GOA driving circuit employs a larger size TFT (for example, the width-to-length ratio of the channel W/L=80 μm/3 μm) to drive load, that is, the width-to-length ratio of the channel of the second transistor 21 is larger than that of the first transistor 11. In this way, through the same process and process conditions, the difference between the threshold voltages of the two TFTs is relatively large. As a result, a control of the manufacturing process is too difficult to be meet requirements on threshold voltages Vth of both the pixel driving circuit and the GOA driving circuit, resulting in poor circuit function or even failure.

Figure 7:
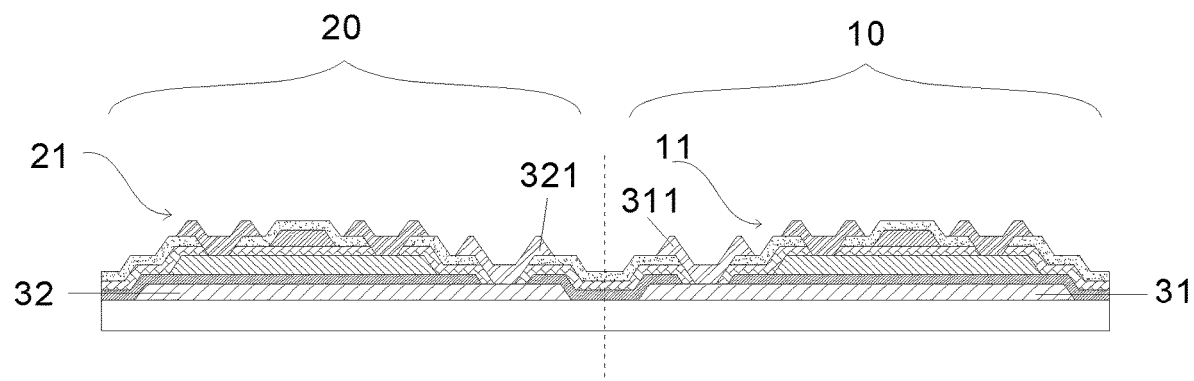
FIG. 7 is a schematic structural view of an array substrate according to some embodiments of the present disclosure.

With reference to FIG. 3 and FIG. 7, the array substrate includes a first substrate electrode 31 disposed on a side of the first transistor 11 away from a light exiting direction and a second substrate electrode 32 disposed on a side of the second transistor 21 away from the light exiting direction. The first substrate electrode 31 is configured to adjust the threshold voltage of the first transistor 11, and the second substrate electrode 32 is configured to adjust the threshold voltage of the second transistor 21. There is an open circuit between the first substrate electrode 31 and the second substrate electrode 32, that is, the two electrodes are electrically disconnected with each other, so that the two electrodes may be connected to different adjustment voltages. In this way, the threshold voltages of the first transistor 11 and the second transistor 21 may be adjusted, respectively.

In this way, by providing the first substrate electrode 31 and the second substrate electrode 32, respectively, the threshold voltages of the first transistor 11 and the second transistor 21 may be adjusted by supplying voltages to the substrate electrodes. Thereby, Vth values of the TFT devices in the pixel area and the GOA area may be adjusted as required, so as to make the pixel driving circuit and the GOA driving circuit operate in their respective suitable working states, thereby solving the problem of the threshold voltage mismatch between the small-size TFT and the large-size TFT. Therefore, it is beneficial to the manufacturing process control, and it also solves the problem that optimal operating points (such as ideal threshold voltages Vth) of the pixel driving circuit and the GOA driving circuit is inconsistent.

As shown in FIGS. 3 and 7, the substrate electrode 31 in the display area of the array substrate and the substrate electrode 32 in the non-display area of the array substrate need to be electrically disconnected to provide voltages respectively. In other words, the substrate electrode 31 may be connected to the first adjustment voltage V1, the substrate electrode 32 may be connected to the second adjustment voltage V2, and the first adjustment voltage V1 and the second adjustment voltage V2 have different values. In other words, the absolute value of the first adjustment voltage V1 is different from the absolute value of the second adjustment voltage V2. For example, the first adjustment voltage is related to the threshold voltage of the first transistor 11, and the second adjustment voltage is related to the threshold voltage of the second transistor 21. The substrate electrode 31 in the display area and the substrate electrode 32 in the non-display area are lead out through respective signal lines to an external circuit, for example, to pins of an external drive chip (e.g., IC) or flexible circuit board (i.e., FPC), as shown in FIG. 3. By supplying different voltages to the substrate electrodes in the pixel area and the GOA area, the threshold voltages of the TFTs in these two areas are adjusted to appropriate values so as to satisfy a normal operation of the circuit.

In an exemplary embodiment, the size of the first transistor 11 is smaller than the size of the second transistor 21, specifically, the width-to-length ratio of the channel of the first transistor 11 is smaller than that of the second transistor 21. Accordingly, the absolute value of the first adjustment voltage is smaller than the absolute value of the second adjustment voltage.

For example, the first transistor 11 is a driving transistor of a pixel driving circuit, and its width-to-length ratio of the channel W/L=3 μm/3 μm; the second transistor 21 is a driving transistor of a GOA driving circuit, and its width-to-length ratio of the channel W/L=80 μm/3 μm. The ideal threshold voltage Vth of the first transistor 11 is around −2.5V, and the ideal threshold voltage Vth of the second transistor 21 is around −4V. In the process of manufacturing the array substrate, process steps may be controlled so that the threshold voltage Vth of the formed thin film transistor is about −2.5V. Then, the first adjustment voltage may be set to be equal to 0V, and the second adjustment voltage may be set to be larger than 0V, that is, the first transistor 11 is in a zero bias state, and the second transistor 21 is in a reverse bias state. In this way, the threshold voltage of the first transistor 11 may be maintained at −2.5V, and the threshold voltage of the second transistor 21 may be adjusted to −4V, so that both the first transistor 11 and the second transistor 21 work at their optimum working points.

Figure 8:
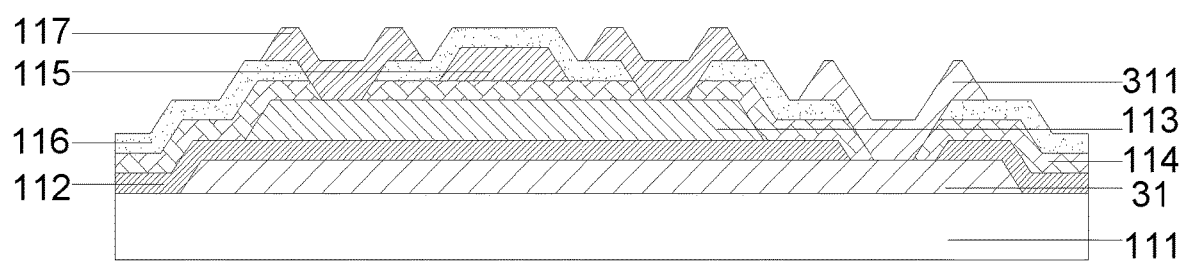
FIG. 8 is a schematic structural view of an array substrate according to some embodiments of the present disclosure.

As shown in FIG. 8, taking the display area as an example, the array substrate includes a base substrate 111, a first substrate electrode 31, a buffer layer 112, an active layer 113, a gate insulating layer 114, a gate electrode 115, an interlayer dielectric layer 116 and a source-drain electrode 117 which are disposed from bottom to top. The active layer 113, the gate insulating layer 114, the gate electrode 115, the interlayer dielectric layer 116, and the source-drain electrode 117 constitute the first transistor 11. The first substrate electrode 31 is located on the side of the first transistor 11 away from the light exiting direction, and it is connected to an external circuit through a via hole 311 to be supplied with the adjustment voltage. Similarly, the second substrate electrode 32 is connected to the external circuit through a via hole 321 to be supplied with the adjustment voltage, as shown in FIG. 2 and FIG. 7.

For example, referring to FIG. 8, a projection of the gate electrode 115 of the first transistor 11 on a plane, where the substrate electrode 31 is located, is located in the substrate electrode 31. Similarly, referring to FIG. 7, a projection of the gate electrode of the second transistor 21 on a plane, where the substrate electrode 32 is located, is located in the substrate electrode 32. In this way, it is advantageous to adjust the threshold voltage of the first transistor based on the substrate bias effect.

It should be noted that, in the embodiments of the present disclosure, an area of a projection of the substrate electrode on the base substrate may be larger than an area of the projection of the gate electrode of the transistor on the base substrate. For example, projections of the active layer and the source-drain electrode of the transistor on the base substrate may all fall within the projection of the substrate electrode on the base substrate.

With reference to FIGS. 7 and 8, a part of the buffer layer 112 is located between the substrate electrode 31 and the substrate electrode 32 so that the open circuit is formed between the substrate electrode 31 and the substrate electrode 32.

As an optional implementation of the present disclosure, the substrate electrode 31/32 may also be used as a light shielding layer of the array substrate. For example, the projection of the active layer of each of the first transistor 11 and the second transistor 21 on the plane, where the substrate electrode is located, is located in the substrate electrode, so that the substrate electrode 31/32 may prevent light incident from a back side of the array substrate from illuminating the active layer, thereby preventing photo-generated carriers due to the light illumination from being generated in the active layer, which may otherwise affect the device performance adversely. The light shielding layer is usually made of metal, such as metal molybdenum (Mo) or the like, so that the substrate electrode and the light shielding layer are simultaneously manufactured by using metal materials, thereby saving materials and processes, and achieving two effects of light-shielding and threshold voltage adjustment simultaneously.

Optionally, the array substrate may further include a light shielding layer for blocking light incident from the back side of the array substrate so as to prevent the light from illuminating the active layers of the first transistor and the second transistor, thereby preventing photo-generated carriers due to the light illumination from being generated in the active layer, which may otherwise affect the device performance adversely. For example, the substrate electrode 31/32 may be on the same layer as the light shielding layer. In this way, the substrate electrode and the light shielding layer are co-layered, thereby reducing the overall thickness of the array substrate. For example, the substrate electrode and the light shielding layer may be manufactured through one patterning process.

It should be noted that, in the context, an expression "located in the same layer" may express that two film layers, parts or elements may be formed through one patterning process, or surfaces of the two film layers, parts or elements close to the base substrate are in contact with the same layer.

In the embodiments of the present disclosure, the first substrate electrode 31 is directly disposed on the base substrate 111, and the light shielding layer is also directly disposed on the base substrate 111, so that the light shielding layer may be used as the substrate electrode, thereby obtaining the first substrate electrode 31 having a light-shielding effect. The second substrate electrode 32 may be produced in the similar way.

Figure 9:
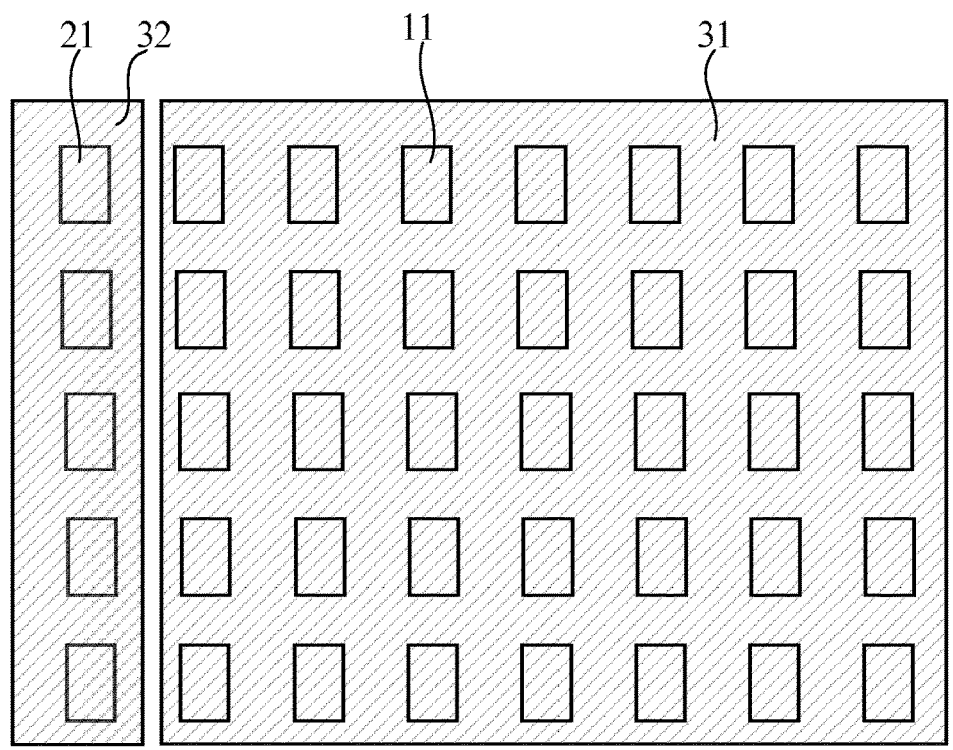
FIG. 9 is a plan view of a substrate electrode and a transistor included in an array substrate according to some embodiments of the present disclosure.

As an optional embodiment, referring to FIG. 9, the first substrate electrode 31 and the second substrate electrode 32 are planar. A plurality of first transistors 11 are provided. A projection of each of the plurality of first transistors 11 on the plane, where the first substrate electrode 31 is located, is located in the first substrate electrode 31. Alternatively or additionally, A plurality of second transistors 21 are provided. A projection of each of the plurality of second transistor 21 on the plane, where the second substrate electrode 32 is located, is located in the second substrate electrode 32.

In this way, when the threshold voltages of the first transistors 11 are adjusted by using the planar first substrate electrode 31, the adjustment may be performed with reference to an average value or a center point value of the threshold voltages of the first transistors 11, so as to ensure that each of the first transistors 11 may operate in the optimum working state as much as possible. Similarly, the planar second substrate electrode 32 may also adjust the threshold voltages of the second transistors 21 in the similar way.

Figure 10:
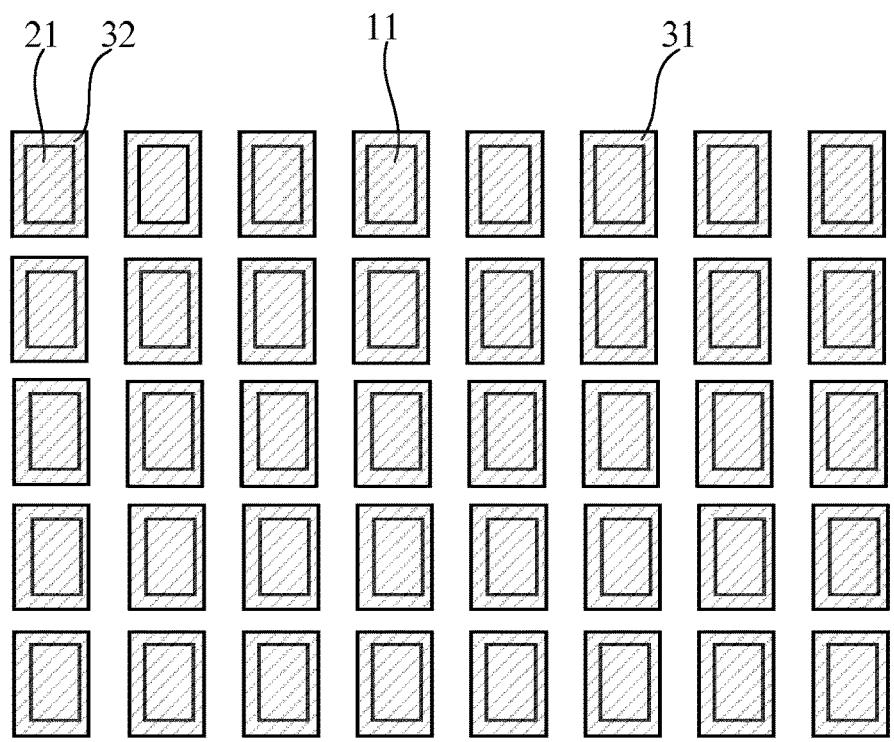
FIG. 10 is another plan view of a substrate electrode and a transistor included in an array substrate according to some embodiments of the present disclosure.

As another optional embodiment, referring to FIG. 10, a plurality of first substrate electrodes 31 and a plurality of second substrate electrodes 32 are provided. The plurality of first substrate electrodes 31 are arranged in an array. A plurality of first transistors 11 are provided and arranged in an array. Projections of the plurality of first transistors 11 on the plane, where the first substrate electrodes are located, are located in the plurality of first substrate electrodes 31 in one-to-one correspondence. Alternatively or additionally, a plurality of second transistors 21 are provided, and projections of the plurality of second transistors 21 on the plane, where the second substrate electrodes are located, are located in the plurality of second substrate electrodes 32 in one-to-one correspondence.

In this way, since each transistor corresponds to one substrate electrode, a corresponding adjustment voltage may be provided to each substrate electrode, so that each transistor may operate in an optimal state.

In addition, the substrate electrodes added in the embodiments of the present disclosure may also be compatible with existing processes, such as integration with optical fingerprint recognition technology.

In the optical fingerprint recognition technology, an optical sensor is usually required to be placed on a back face of a screen. In order to meet recognition requirements of the sensor, it is necessary to form several light-transmitting holes in an array on the screen to collect fingerprint information. Moreover, in order to prevent parasitic light from entering the sensor, which otherwise causes vague images, it is necessary to provide light shielding layer at other locations, and the substrate electrode may function to shield light.

Moreover, in addition to shielding the parasitic light, the substrate electrode may also protect the TFT from light injection so as to improve the performance of the TFT.

In addition, the design of the substrate electrode in the present disclosure is not only compatible with fingerprint recognition technology, but also compatible with infrared sensing, facial recognition and other technologies. These compatible designs all fall within the protection scope of the present disclosure, and are not limited to the embodiments of the present disclosure.

In a second aspect of the embodiments of the present disclosure, a display panel is provided, which may solve the problem caused by the difference in threshold voltages to a certain extent.

The display panel includes any embodiment or a combination of embodiments of the array substrate as described above.

In the display panel provided by the embodiments of the present disclosure, by providing the substrate electrode on the side of the transistor away from the light exiting direction, the threshold voltage of the transistor above the substrate electrode may be adjusted by using the substrate electrode based on the principle of the substrate bias effect. In this way, even if the threshold voltage of the transistor is deviated due to a manufacturing process of the transistor, the threshold voltage of the transistor may be adjusted by using the substrate electrode so that the transistor may operate in an ideal state.

In a third aspect of the embodiments of the present disclosure, a display device is provided, which may solve the problem caused by the difference in threshold voltages to a certain extent.

The display device includes any embodiment or a combination of embodiments of the array substrate as described above.

It should be noted that the display device in the embodiments may be any product or component with a display function, such as electronic paper, mobile phone, tablet computer, television, notebook computer, digital photo frame, and navigator.

In the display device provided by the embodiments of the present disclosure, by providing the substrate electrode on the side of the transistor away from the light exiting direction, the threshold voltage of the transistor above the substrate electrode may be adjusted by using the substrate electrode based on the principle of the substrate bias effect. In this way, even if the threshold voltage of the transistor is deviated due to a manufacturing process of the transistor, the threshold voltage of the transistor may be adjusted by using the substrate electrode so that the transistor may operate in an ideal state.

In a fourth aspect of the embodiments of the present disclosure, a control method of the array substrate is provided, which may solve the problem caused by the difference in threshold voltages to a certain extent.

As shown in FIG. 11, the control method of the array substrate includes:

step 41: determining the threshold voltages of both the first transistor and the second transistor; and step 42: supplying a driving voltage to the first transistor and the second transistor, in a case where the substrate electrode is provided on a side of one of the first transistor and the second transistor away from the light exiting direction, setting the driving voltage to be equal to the threshold voltage of the other one of the first transistor and the second transistor, below which the substrate electrode is not provided, and supplying an adjustment voltage to the substrate electrode so that the one of the first transistor and the second transistor, below which the substrate electrode is provided, operates at its threshold voltage; in a case where the substrate electrode is provided on sides of both the first transistor and the second transistor away from the light exiting direction, according to the driving voltage, supplying a first adjustment voltage to the substrate electrode on the side of the first transistor away from the light exiting direction so that the first transistor operates at its threshold voltage, and supplying a second adjustment voltage to the substrate electrode on the side of the second transistor away from the light exiting direction so that the second transistor operates at its threshold voltage.

In the embodiments of the present disclosure, the value of the first adjustment voltage is different from the value of the second adjustment voltage.

For example, the first transistor is a driving transistor of a pixel driving circuit, and the second transistor is a driving transistor of a GOA driving circuit. Since the size (e.g., the width-to-length ratio) of the first transistor is different from the size (e.g., the width-to-length ratio) of the second transistor, the threshold voltage of the first transistor is different from the threshold voltage of the second transistor.

For example, in the above step 42, in the case where the substrate electrode is provided on the side of the second transistor away from the light exiting direction (the substrate electrode is not provided on the side of the first transistor away from the light exiting direction), the driving voltage may be set to be equal to the threshold voltage of the first transistor, and an adjustment voltage may be supplied to the substrate electrode. For example, the absolute value of the adjustment voltage in this case may be equal to an absolute value of a difference between the threshold voltage of the second transistor and the driving voltage, so that the second transistor may operate at its threshold voltage.

For another example, in the above step 42, in the case where the substrate electrodes are provided on side of both the first transistor and the second transistor away from the light exiting direction, the driving voltage may be set to be equal to the threshold voltage of the first transistor, in this case, the value of the first adjustment voltage may be equal to zero, so that the first transistor operates at its threshold voltage; the absolute value of the second adjustment voltage may be equal to an absolute value of a difference between the threshold voltage of the second transistor and the driving voltage, so that the second transistor may operate at its threshold voltage. Alternatively, the driving voltage may be set to be equal to an average value of the threshold voltage of the first transistor and the threshold voltage of the second transistor, in this case, the absolute value of the first adjustment voltage may be equal to an absolute value of a difference between the threshold voltage of the first transistor and the driving voltage, so that the first transistor may operate at its threshold voltage, and the absolute value of the second adjustment voltage may be equal to an absolute value of a difference between the threshold voltage of the second transistor and the driving voltage, so that the second transistor may operate at its threshold voltage.

In the control method of an array substrate according to some embodiments of the present disclosure, by providing the substrate electrode on the side of the transistor away from the light exiting direction, the threshold voltage of the transistor above the substrate electrode may be adjusted by using the substrate electrode based on the principle of the substrate bias effect. In this way, even if the threshold voltage of the transistor is deviated due to a manufacturing process of the transistor, the threshold voltage of the transistor may be adjusted by using the substrate electrode so that the transistor may operate in an ideal state.

It should be noted that, the adjustment voltage may be determined by inputting a preset detection voltage to the transistor, collecting the corresponding electrical signal to calculate an offset of the threshold voltage, then calculating the adjustment voltage, and then inputting the adjustment voltage into the corresponding substrate electrode. In addition, during the adjustment process, the working state of the transistor may be detected at any time and the adjustment voltage may be dynamically adjusted. In other words, the adjustment voltage may be changed according to the working state of the transistor, and may be adjusted according to specific conditions.

In a fifth aspect of the embodiments of the present disclosure, a method of manufacturing the array substrate is provided, which may solve the problem caused by the difference in threshold voltages to a certain extent.

Figure 12:
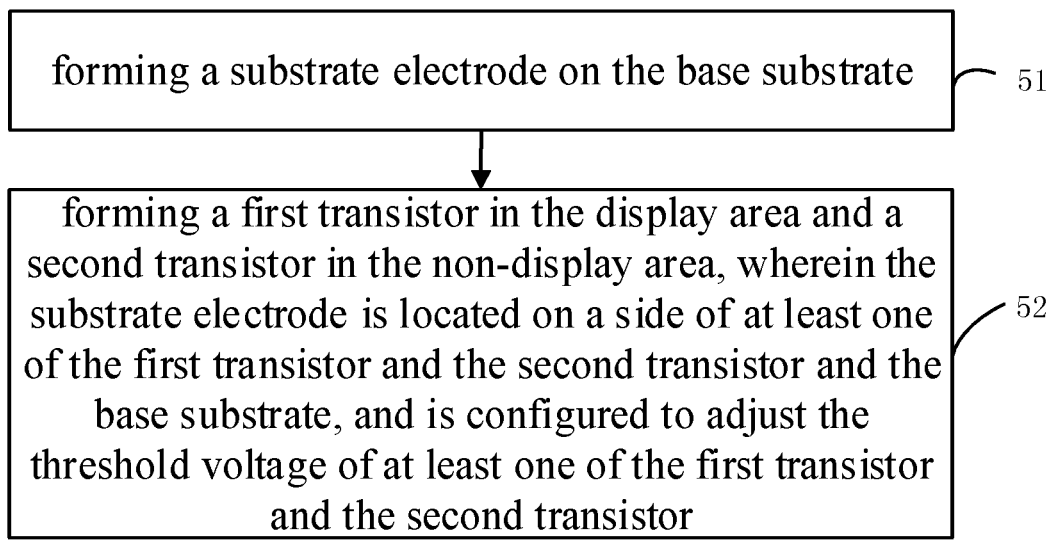
FIG. 12 is a schematic flowchart of a method of manufacturing an array substrate according to some embodiments of the present disclosure.

As shown in FIG. 12, the method of manufacturing the array substrate includes:

step 51: forming a substrate electrode on the base substrate; and step 52: forming a first transistor in the display area and a second transistor in the non-display area.

In the embodiments, the substrate electrode is located on a side of at least one of the first transistor and the second transistor away from the light exiting direction, and is configured to adjust the threshold voltage of at least one of the first transistor and the second transistor.

In the method of manufacturing an array substrate according to some embodiments of the present disclosure, by providing the substrate electrode on the side of the transistor away from the light exiting direction, the threshold voltage of the transistor above the substrate electrode may be adjusted by using the substrate electrode based on the principle of the substrate bias effect. In this way, even if the threshold voltage of the transistor is deviated due to a manufacturing process of the transistor, the threshold voltage of the transistor may be adjusted by using the substrate electrode so that the transistor may operate in an ideal state.

As an embodiment of the present disclosure, the step of forming the substrate electrode on the base substrate includes: forming a light shielding layer on the base substrate, the light shielding layer being configured to block light incident from the back side of the array substrate to prevent the light from illuminating the active layers of the first transistor and the second transistor; and forming the substrate electrode in the light shielding layer through a patterning process. In this way, by using the light shielding layer to make the substrate electrode, the substrate electrode may not only adjust the threshold voltage of the transistor, but also realize the light shielding effect.

As another embodiment of the present disclosure, the step of forming the substrate electrode on the base substrate includes: forming a metal thin film on the base substrate; and forming the light shielding layer and the substrate electrode in the metal thin film through one patterning process. The light shielding layer is used to block light incident from the back side of the array substrate to prevent the light from illuminating the active layers of the first transistor and the second transistor.

In fact, the substrate electrode itself is located on the side of the transistor away from the light exiting direction. If the substrate electrode has a light shielding effect, the formed substrate electrode may be used as the light shielding layer.

It should be noted that there are usually various methods for forming a thin film, such as deposition, coating, and sputtering. The patterning process suitable for the classic mask process usually includes photoresist coating, exposure, development, etching, photoresist stripping and other processes. Sometimes, patterns may be formed without the classic patterning process, for example, by using the lift-off technique. In reality, there is no need to use a mask to perform the patterning process, for example, printing and other patterning methods may be used. In other words, any process that may form a desired pattern may be called a patterning process.

It should be noted that the above-mentioned layer-forming operations include, but are not limited to, (chemical phase, physical phase) deposition film formation, (magnetron) sputtering film formation, and those skilled in the art can understand that after forming each layer, corresponding patterns may be further formed on it as needed, which will not be repeated in the present disclosure.

The technical solution of the present disclosure has been described in detail above with reference to the drawings. Considering that in the prior art, the source-drain electrode and the active layer are in different layers, the substrate thickness is large and the manufacturing process is complicated. Through the technical solution of the present application, the source electrode, the drain electrode, the data line and the active layer may be prepared in the same layer by doping copper nitride, thereby reducing the thickness of the array substrate and simplifying the manufacturing process of the array substrate.

It should be noted that in the drawings, the size of layers and regions may be exaggerated for clarity of illustration. And it is understood that when an element or layer is referred to as being "on" another element or layer, it may be directly on the other element, or intervening layers may be present. In addition, it can be understood that when an element or layer is referred to as being "under" another element or layer, it may be directly under the other element, or more than one intervening layer or element may be present. In addition, it can also be understood that when a layer or element is referred to as being "between" two layers or two elements, it may be the only layer between the two layers or two elements, or more than one intervening layer or components may be present. Similar reference signs indicate similar elements throughout the specification.

In this disclosure, the terms "first", "second", "third", and "fourth" are used for descriptive purposes only, and cannot be understood as indicating or implying relative importance. The term "plurality" refers to two or more, unless expressly defined otherwise.

Those skilled in the art should understand that the above description is only specific embodiments of the present disclosure and is not intended to limit the present disclosure. Any modification, equivalent replacement, or improvement made within the spirit and principle of the present disclosure shall be included in the scope of protection of the present disclosure.

What is claimed is:

1. An array substrate, comprising:
   a base substrate comprising a display area and a non-display area;
   a first transistor in the display area;
   a second transistor in the non-display area, a size of the first transistor being smaller than a size of the second transistor; and
   a substrate electrode, the substrate electrode comprising:
      a first substrate electrode between the first transistor and the base substrate; and
      a second substrate electrode between the second transistor and the base substrate,
   wherein the first substrate electrode and the second substrate electrode are configured to adjust threshold voltages of the first transistor and the second transistor, respectively, there is an open circuit between the first substrate electrode and the second substrate electrode, the first substrate electrode is supplied with a first adjustment voltage, the second substrate electrode is supplied with a second adjustment voltage, and an absolute value of the first adjustment voltage is different from an absolute value of the second adjustment voltage,
   wherein an absolute value of the threshold voltage of the first transistor is different from an absolute value of the threshold voltage of the second transistor, wherein the absolute value of the threshold voltage of the first transistor is smaller than the absolute value of the threshold voltage of the second transistor, wherein the absolute value of the first adjustment voltage is smaller than the absolute value of the second adjustment voltage, wherein the first transistor is a driving transistor of a pixel driving circuit, the second transistor is a driving transistor of a GOA driving circuit, and the pixel driving circuit is configured to drive an organic light emitting diode, and wherein a width-to-length ratio of a channel of the first transistor is smaller than a width-to-length ratio of a channel of the second transistor.

2. The array substrate of claim 1, wherein the first adjustment voltage is equal to 0 volt.

3. The array substrate of claim 1, wherein the first substrate electrode is a planar electrode, a plurality of first transistors are provided, and projections of the plurality of first transistors on a plane, where the first substrate electrode is located, are all located in the first substrate electrode; and/or, the second substrate electrode is a planar electrode, a plurality of second transistors are provided, and projections of the plurality of second transistors on a plane, where the second substrate electrode is located, are all located in the second substrate electrode.

4. The array substrate of claim 1, wherein a plurality of first substrate electrodes are provided, the plurality of first substrate electrodes are arranged in an array, a plurality of first transistors are provided, the plurality of first transistors are arranged in an array, and projections of the plurality of first transistors on a plane, where the first substrate electrodes are located, are located in the plurality of first substrate electrodes in one-to-one correspondence; and/or, a plurality of second substrate electrodes are provided, the plurality of second substrate electrodes are arranged in an array, a plurality of second transistors are provided, the plurality of second transistors are arranged in an array, and projections of the plurality of second transistors on a plane, where the second substrate electrodes are located, are located in the plurality of second substrate electrodes in one-to-one correspondence.

5. The array substrate of claim 1, wherein the first transistor comprises a gate electrode, and a projection of the gate electrode of the first transistor on a plane, where the first substrate electrode is located, is located in the first substrate electrode; and/or, the second transistor comprises a gate electrode, and a projection of the gate electrode of the second transistor on a plane, where the second substrate electrode is located, is located in the second substrate electrode.

6. The array substrate of claim 1, wherein the array substrate further comprises a buffer layer on the base substrate, and each of the first transistor and the second transistor comprises an active layer, and the active layer is located on a side of the buffer layer away from the base substrate, and wherein the first substrate electrode and the second substrate electrode are both located on a side of the buffer layer close to the base substrate.

7. The array substrate of claim 6, wherein a part of the buffer layer is located between the first substrate electrode and the second substrate electrode, so that there is the open circuit between the first substrate electrode and the second substrate electrode.

8. The array substrate of claim 1, wherein the first substrate electrode and the second substrate electrode are located in the same layer.

9. The array substrate of claim 8, wherein each of the first transistor and the second transistor comprises an active layer, and a projection of the active layer of the first transistor on a plane, where the first substrate electrode is located, is located in the first substrate electrode, and a projection of the active layer of the second transistor on a plane, where the second substrate electrode is located, is located in the second substrate electrode.

10. The array substrate of claim 1, further comprising a light shielding layer, wherein the light shielding layer is configured to prevent light from a back side of the array substrate from illuminating an active layer of each of the first transistor and the second transistor, and wherein the substrate electrode and the light shielding layer are located in the same layer.

11. A display panel comprising the array substrate of claim 1.

12. A display device comprising the array substrate of claim 1.

13. A control method of an array substrate of claim 1, wherein the control method comprises:

determining threshold voltages of both the first transistor and the second transistor;

supplying a driving voltage to the first transistor, and supplying a first adjustment voltage to the first substrate electrode according to the driving voltage supplied to the first transistor, so that the first transistor operates at its threshold voltage; and supplying a driving voltage to the second transistor, and supplying a second adjustment voltage to the second substrate electrode according to the driving voltage supplied to the second transistor, so that the second transistor operates at its threshold voltage.

14. An array substrate, comprising:

a base substrate comprising a display area and a non-display area;

a first transistor in the display area;

a second transistor in the non-display area; and a substrate electrode between the base substrate and one of the first transistor and the second transistor, wherein a projection of the one of the first transistor and the second transistor on a plane, where the substrate electrode is located, is located within a projection of the substrate electrode on the plane, and a projection of the other one of the first transistor and the second transistor on the plane, where the substrate electrode is located, is spaced from the projection of the substrate electrode on the plane, and the substrate electrode is supplied with an adjustment voltage having an absolute value greater than 0, so as to adjust a threshold voltage of the one of the first transistor and the second transistor, wherein the first transistor is a driving transistor of a pixel driving circuit, the second transistor is a driving transistor of a GOA driving circuit, and the pixel driving circuit is configured to drive an organic light emitting diode, and wherein a width-to-length ratio of a channel of the first transistor is smaller than a width-to-length ratio of a channel of the second transistor.

15. A control method of an array substrate of claim 14, wherein the control method comprises:

determining threshold voltages of both the first transistor and the second transistor;

supplying a driving voltage, which is set to be equal to the threshold voltage of one of the first transistor and the second transistor which is not provided with the substrate electrode, to both the first transistor and the second transistor; and supplying an adjustment voltage to the substrate electrode, so that the other one of the first transistor and the second transistor which is provided with the substrate electrode operates at its threshold voltage.

* * * * *